United States Patent

Rösner et al.

[11] Patent Number: 5,920,778
[45] Date of Patent: Jul. 6, 1999

[54] READ-ONLY MEMORY CELL ARRANGEMENT AND METHOD FOR ITS PRODUCTION

[75] Inventors: Wolfgang Rösner, München; Wolfgang Krautschneider, Hohenthann; Franz Hofmann, München; Lothar Risch, Neubiberg, all of Germany

[73] Assignee: Siemens Aktiengesellschaft, Munich, Germany

[21] Appl. No.: 08/913,740

[22] PCT Filed: Apr. 9, 1996

[86] PCT No.: PCT/DE96/00614

§ 371 Date: Sep. 23, 1997

§ 102(e) Date: Sep. 23, 1997

[87] PCT Pub. No.: WO96/33513

PCT Pub. Date: Oct. 24, 1996

[30] Foreign Application Priority Data

Apr. 21, 1997 [DE] Germany .................... 195 14 834

[51] Int. Cl.$^6$ ...................... H01L 21/8246; H01L 27/112
[52] U.S. Cl. .................. 438/270; 438/276; 257/332; 257/391
[58] Field of Search ...................... 438/130, 268, 438/270, 275, 276, 277, 278; 257/331, 332, 390, 391

[56] References Cited

U.S. PATENT DOCUMENTS

| | | | |
|---|---|---|---|
| 4,630,237 | 12/1986 | Miura et al. | 365/104 |
| 4,663,644 | 5/1987 | Shimizu | 257/331 |
| 4,954,854 | 9/1990 | Dhong et al. | 257/332 |
| 5,385,852 | 1/1995 | Oppermann et al. | 438/270 |
| 5,744,393 | 4/1998 | Risch et al. | 438/276 |

FOREIGN PATENT DOCUMENTS

| | | |
|---|---|---|
| 42 14 923 A1 | 3/1992 | Germany . |
| 59-11671 | 1/1984 | Japan . |
| 2017406 | 3/1979 | United Kingdom . |

*Primary Examiner*—Chandra Chaudhari
*Attorney, Agent, or Firm*—Hill & Simpson

[57] ABSTRACT

In a read-only memory cell arrangement having first memory cells which contain a vertical MOS transistor, and having second memory cells which do not contain vertical MOS transistors, the memory cells are arranged along opposite flanks of strip-shaped parallel insulation trenches (16). The width of the insulation trenches (16) is preferably equal to their separation, so that the memory cell arrangement can be produced with a space requirement of $2F^2$ per memory cell, F being the minimum structure size in the respective technology.

8 Claims, 4 Drawing Sheets

READ-ONLY MEMORY CELL ARRANGEMENT AND METHOD FOR ITS PRODUCTION

BACKGROUND OF THE INVENTION

Memories into which data are written permanently in digital form are required for many electronic systems. Such memories are called, inter alia, read-only memories.

Plastic discs, so-called compact discs, which are coated with aluminium are in widespread use as read-only memories for large quantities of data, in particular the digital recording of music. These discs have two different kinds of point-like depressions in the coating, which are assigned to the logic values zero and one. The information is stored digitally in the arrangement of these depressions.

In order to read the data which are stored on a compact disc, the disc is mechanically rotated in a read apparatus. The point-like depressions are scanned via a laser diode and a photocell. Typical scanning rates in this case are 2×40 kHz. Approximately 5 Gbits of information can be stored on one plastic disc.

The read apparatus has moving parts which undergo mechanical wear, require comparatively large volumes, allow only slow data access and consume a great deal of power. The read apparatus is furthermore sensitive to vibration and can thus be used only to a limited extent for mobile systems.

Semiconductor-based, in particular silicon-based, read-only memories are frequently used for the storage of smaller amounts of data. When the memory cell arrangement is read, the individual memory cells are selected via a word line. The gate electrode of the MOS transistors is in each case connected to a word line. The input of each MOS transistor is connected to a reference line, and the output to a bit line. An assessment is carried out during the reading process to determine whether or not any current is flowing through the transistor. The logic values zero and one are assigned accordingly.

Technically, the storage of zero and one is brought about in the case of these read-only memories by no MOS transistor being produced, or no conductive connection to the bit line being produced, in memory cells in which the logic value assigned to the state "no current flow through the transistor" is stored. Alternatively, the two logic values can be produced by MOS transistors which have different operating voltages as a result of different implantations in the channel region.

These known silicon memories usually have a planar construction. In consequence, a minimal surface area, which is about 6 to 8 $F^2$, is required per memory cell, F being the smallest producible structure size in the respective technology. Planar silicon read-only memories are thus limited to memory densities of about 0.9 bit/$\mu m^2$ when using 0.4 $\mu$m technology.

U.S. Pat. No. 4,954,854 discloses the use of vertical MOS transistors in a read-only memory. The surface of the silicon substrate is for this purpose provided with hole-like trenches against which a source region abuts at the base, against which a drain region, surrounding the trench, abuts at the substrate surface, and along whose flanks a channel region is arranged. The surface of the trench is provided with a gate dielectric, and the trench is filled with a gate electrode. Zero and one are distinguished in this arrangement by no trench being etched and no transistor being produced for one of the logic values. Neighbouring memory cells are insulated from one another by insulating structures arranged laterally with respect to them.

SUMMARY OF THE INVENTION

The object of the invention is to provide a semiconductor-based read-only memory cell arrangement, in the case of which an increased memory density is achieved and which can be produced with a small number of production steps and with a high yield. A further object is to provide a method for the production of such a memory cell arrangement.

In the read-only memory cell arrangement according to the invention, a cell array having memory cells is provided in a semiconductor substrate, preferably of monocrystalline silicon, or in a silicon layer of an SOI substrate. In this case, a first logic value is respectively stored in first memory cells and a second logic value is respectively stored in second memory cells. The first memory cells contain an MOS transistor which is vertical to the main surface of the semiconductor substrate. In contrast, the second memory cells do not contain an MOS transistor.

The read-only memory cell arrangement is programmed during production by producing vertical MOS transistors at predetermined places for first memory cells, whereas predetermined locations for second memory cells are masked so that MOS transistors are not produced there.

A plurality of essentially parallel strip-shaped insulation trenches are provided in the cell array. The insulation trenches extend over the entire cell array. The memory cells are each arranged on opposite flanks of the insulation trenches, with the surface of the memory cells overlapping the respective flank.

At the bottom of the insulation trenches, and on the main surface of the semiconductor substrate, strip-shaped doped regions are arranged in each case between neighbouring insulation trenches, these regions being doped in the opposite way to the semiconductor substrate. The strip-shaped doped regions extend parallel to the insulation trenches over the entire cell array. The vertical MOS transistors of the first memory cells are produced in such a way that, in each case, a strip-shaped doped region extending at the bottom of an insulation trench and a strip-shaped doped region arranged on the main surface between the insulation trench and the neighbouring insulation trench form the source/drain regions of the MOS transistor. The gate dielectric and gate electrode of the MOS transistor are arranged in a hole which abuts against the flank of the insulation trench and extends into the insulation trench. This hole is filled with a gate dielectric and a gate electrode.

Word lines which extend transversely to the insulation trenches are arranged on the main surface. The word lines are each connected to gate electrodes of vertical MOS transistors arranged below the respective word line.

The strip-shaped doped regions which are arranged at the bottom of the insulation trenches, and in each case between neighbouring insulation trenches on the main surface of the semiconductor substrate, are used as a bit or reference line for reading the storage cells. The memory cell to be evaluated is selected via the word line. An assessment is made as to whether or not a current is flowing between the associated strip-shaped doped regions. If the memory cell is a first memory cell, then the associated strip-shaped doped regions form the source/drain regions of a vertical MOS transistor whose gate electrode is connected to the word line, so that in this case a current flows. In contrast, if the memory cell is a second memory cell, then there is no hole, no gate dielectric and no gate electrode at this location. On the main surface of the semiconductor substrate, the word line extends only over an insulator. No current can therefore flow between the associated strip-shaped doped regions.

The separation between neighbouring insulation trenches is preferably chosen to be essentially equal to the width of the insulation trenches. In the first memory cells, each of the holes preferably extends in this case to half the width of the insulation trench. The memory cell area extends, perpendicularly to the length of the insulation trenches, in each case from the centre of the insulation trench as far as half the distance to the neighbouring insulation trench. If the width of the insulation trenches is chosen according to the minimum structure width F in the respective technology, and the width of the word lines and separation of the word lines are likewise chosen according to the minimum structure width F in the respective technology, then the space required for the memory cell is 2 $F^2$. Assuming a minimum structure width of F=0.4 $\mu$m, then the read-only memory cell arrangement achieves a memory density of approximately 3.1 bit/$\mu m^2$.

For production of the read-only memory cell arrangement according to the invention, a doped region is preferably produced first of all on the main surface of the semiconductor substrate, where the cell array is to be. An etching barrier layer (polysilicon or nitride) is then preferably applied. After this, trenches are etched by using a trench mask, the strip-shaped doped regions between neighbouring insulation trenches being formed on the main surface by structuring the doped region. The strip-shaped doped regions arranged at the bottom of the trenches are then formed by ion implantation. During this, the main surface is protected between neighbouring trenches by the trench mask. In order to avoid additional doping of the side walls of the trenches by scattered ions, it is advantageous to provide the side walls of the trenches with spacers, for example made of $SiO_2$, before the ion implantation.

After the implantation to form the strip-shaped doped regions at the bottom of the trenches, the trenches are filled with insulating material, for example $SiO_2$.

After the trenches have been filled, the memory cells are produced, the read-only memory cell arrangement being programmed. For this purpose, a photoresist mask is produced which leaves the main surface of the semiconductor substrate exposed only at the locations where it is desired to form a hole for a first memory cell. In an anisotropic dry etching process, the holes are etched at the flank of the insulation trenches. The semiconductor surface is then exposed at the flank. The hole extends into the insulation trench. Parallel to the insulation trench, the hole is preferably limited according to the width of the word lines. The hole extends to the surface of the strip-shaped doped region at the bottom of the insulation trench. The semiconductor surface in the hole is provided with a gate dielectric. The hole is then filled with a gate electrode.

It is within the scope of the invention to provide an etching barrier layer under the trench mask, this barrier layer being structured in accordance with the trench mask before the trenches are etched. The etching barrier layer is made of a material such that the insulating material of the insulation trenches can be etched selectively with respect to the etching barrier layer. The structured etching barrier layer acts together with the photoresist mask as an etching mask during etching of the holes. The width of the insulation trenches can thus be set according to the minimum structure width F. The holes in the photoresist mask likewise have linear dimensions corresponding to the minimum structure width F. The photoresist mask is adjusted relative to the insulation trenches in such a way that the centre of the holes is in each case arranged offset by one half of the width of the insulation trenches relative to the centre of the insulation trenches. In this case the fact that the adjustment accuracy is greater than the minimum structure width F is exploited. In 0.4 $\mu$m technology, the minimum structure size is F=0.4 $\mu$m, and adjustment is carried out with an accuracy of better than F/3=0.13 $\mu$m.

Since the etching barrier layer and the photoresist mask act together as an etching mask, the width of the etched hole is reduced by the overlap of the etching barrier layer and the photoresist mask. In this way, a hole of width ½ F can be etched in an F technology.

It is within the scope of the invention, during production of the insulation trenches in the cell array, at the same time to form insulation trenches in a periphery region of the memory cell arrangement which contains a drive circuit for the memory cell arrangement. This requires photoresist masks which cover the periphery during the doping steps for forming the strip-shaped doped regions in the cell array. Furthermore, the etching barrier layer, if present, must be removed from the periphery before MOS transistors for driving the memory cell arrangement are formed at the periphery.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawing, and in which:

DESCRIPTION OF THE PREFERRED EMBODIMENTS

Figure 1:
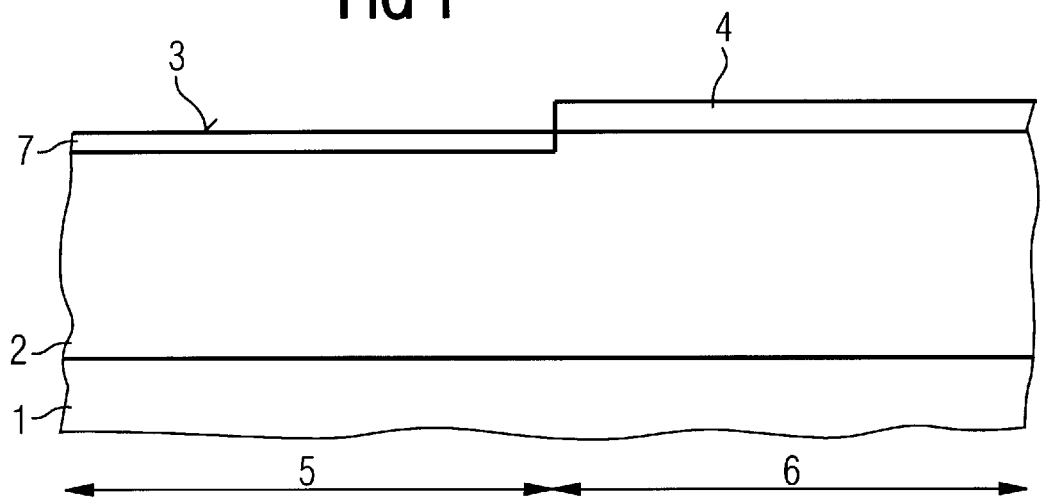
FIG. 1 shows a substrate having a doped region in the cell array.

A p-doped well 2 with a dopant concentration of $2 \times 10^{17}$ $cm^{-3}$ is produced by implantation and subsequent heat-treatment in a substrate 1 of, for example, p-doped monocrystalline silicon with a dopant concentration of $5 \times 10^{15}$ $cm^{-3}$ (see FIG. 1). A 20 nm scattering oxide is then deposited over the whole surface in a CVD-TEOS process (not represented). A photoresist mask 4 which defines a region for a cell array 5 and a periphery 6 is then produced on a main surface 3 of the substrate 1. The photoresist mask 4 covers the region for the periphery 6, whereas the main surface 3 is exposed in the region for the cell array 5.

An n$^+$-doped region 7 which has a dopant concentration of $1\times10^{21}$ cm$^{-3}$ and extends on the main surface 3 over the region for the cell array 5 is then produced by implantation at 50 keV, $5\times10^{15}$ cm$^{-2}$.

The photoresist mask 4 is removed and a heat-treatment step for activating the dopants follows. The n$^+$-doped region 7 has a depth of approximately 200 nm. The p-doped well 2 has a depth of 2 μm.

The scattering oxide is removed by wet chemical means and an SiO$_2$ layer 8 is produced over the entire surface at a thickness of, for example, 60 nm by thermal oxidation. An etching barrier layer 9 is applied onto the SiO$_2$ layer 8, this barrier layer being, for example, Si$_3$N$_4$— or polysilicon-deposited in a CVD process. The etching barrier layer 9 is produced to a thickness of, for example, 100 nm.

Figure 2:
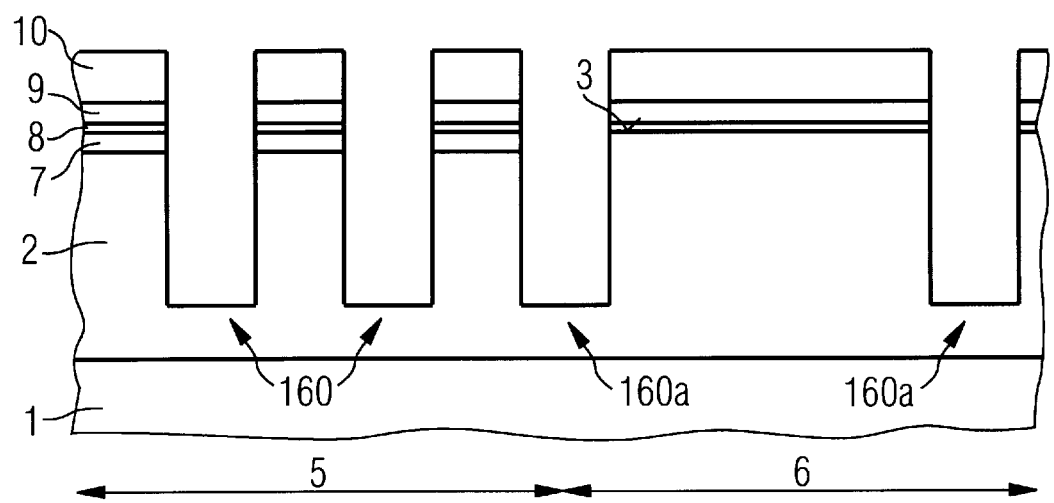
FIG. 2 shows the substrate with a trench mask after the etching of trenches.

Next, in order to form a trench mask 10, a 300 nm SiO$_2$ layer is deposited in a TEOS process and is structured with the aid of photolithographic methods by anisotropic dry etching, for example with CHF$_3$, O$_2$ (see FIG. 2).

The etching barrier layer 9 and the SiO$_2$ layer 8 are then structured by anisotropic dry etching in accordance with the trench mask 10. If the etching barrier layer 9 consists of Si$_3$N$_4$, the etching of it is carried out using CHF$_3$, O$_2$, and if it consists of polysilicon, the etching is carried out using HBr, Cl$_2$. The SiO$_2$ layer 8 is etched using CHF$_3$, O$_2$. After a photoresist mask which was applied for structuring the trench mask 10 has been removed, the trenches are etched. The trenches are etched in an anisotropic dry etching process using, for example, HBr, He, O$_2$, NF$_3$. This produces trenches 160 which have a depth of, for example, 0.6 μm. The trenches 160 extend over a block of the cell array 5. They have a length of, for example, 250 μm and a width of, for example, 0.4 μm. Neighbouring trenches 160 are arranged in the cell array 5 at a separation of 0.4 μm. The trenches 160 extend essentially parallel. 64 parallel trenches, for example, are produced in the block of the cell array 5.

At the same time, trenches 160a which are required for a shallow trench isolation in standard logic processes are produced at the periphery. The trenches 160a at the periphery 6 have dimensions of, for example, 0.4 μm in width.

Figure 3:
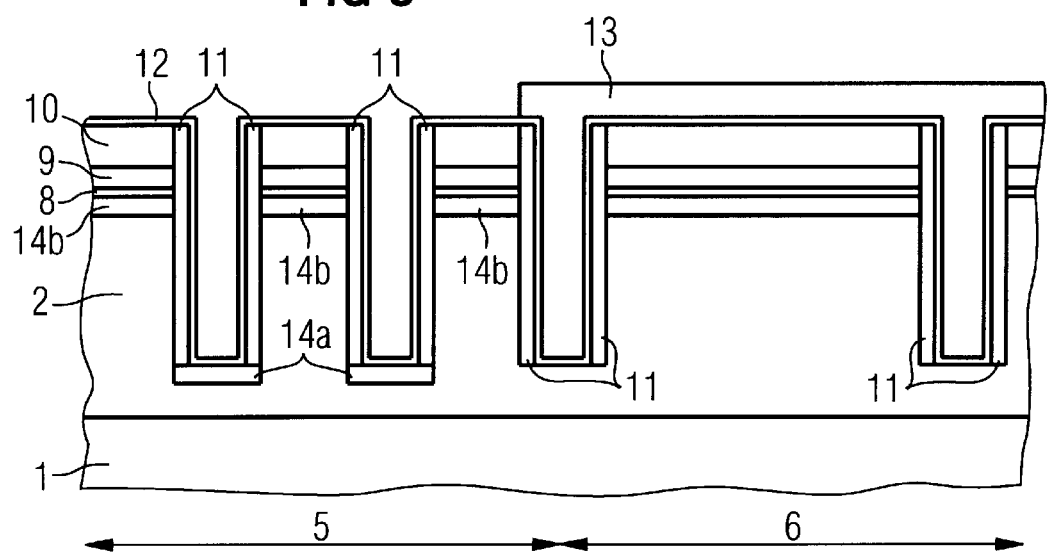
FIG. 3 shows the substrate after the formation of strip-shaped doped regions at the bottom of the trenches.

By conformal deposition of a TEOS-SiO$_2$ layer at a thickness of 60 nm and subsequent anisotropic dry etching using CHF$_3$, O$_2$, SiO$_2$ spacers 11 are produced at vertical flanks, in particular of the trenches 160 and of the trench mask 10 (see FIG. 3).

A scattering oxide layer 12 is then deposited to a thickness of 20 nm over the entire surface in a TEOS process. A photoresist mask 13 which covers the periphery 6 and leaves the cell array 5 exposed is produced. Ion implantation is carried out, in which n$^+$-doped strip-shaped regions 14a are formed at the bottom of the trenches 160. The photoresist mask 13 is stripped and the doped regions are activated by a heat-treatment step. A dopant concentration of, for example, $10^{21}$ cm$^{-3}$ is set up in the strip-shaped doped regions 14a. On the main surface 3 of the semiconductor substrate 1, doped regions 14b are formed between neighbouring trenches 160 during the trench etching by structuring the n$^+$-doped region 7.

The trench mask 10 is then removed. The trench mask 10 is removed, for example, using HF vapour (Excalibur system) or in an EF dip. The scattering oxide layer 12 and the SiO$_2$ spacers 11 are also removed when the trench mask 10 is removed. The surfaces of the p-doped well 2 are then exposed in the trenches 160. In order to improve the quality of these crystal surfaces, an SiO$_2$ layer is produced to a thickness of 20 nm by thermal oxidation. For the sake of clarity, this SiO$_2$ layer is not represented in the figures.

Figure 4:
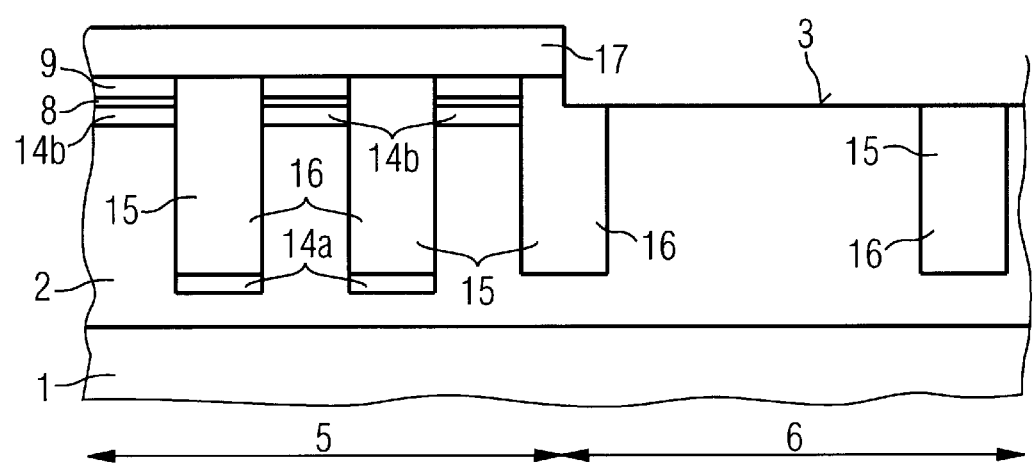
FIG. 4 shows the substrate after the trenches have been filled with insulating material.

The trenches 160 are then filled by depositing a TEOS-SiO$_2$ layer to a thickness of, for example, 800 nm. The proportions of the TEOS-SiO$_2$ layer above the main surface 3 are removed by back-etching using CHF$_3$, O$_2$. The back-etching ends at the etching barrier layer 9. The trenches 160 are provided with an SiO$_2$ trench filling 15 in this process step. The trenches 160 and the trench filling 15 together form insulation trenches 16 (see FIG. 4). In a heat-treatment step at, for example, 900° C. for, for example, 10 min, the trench filling 15 is compacted. The etching properties of the SiO$_2$ are thereby altered.

A photoresist mask 17 which covers the cell array 5 is produced. By using the photoresist mask 17 as an etching mask, the etching barrier layer 9 is removed in the region of the periphery 6 and in the region of the contacts with the bit lines at the edge of the cell array. Implantation with, for example, $8\times10^{12}$ cm$^{-2}$ of boron is then carried out, by means of which the threshold voltage of MOS transistors to be produced later in the region of the periphery is set. The SiO$_2$ layer 8 in the region of the periphery 6 is finally removed and the photoresist mask 17 is stripped.

Figure 5:
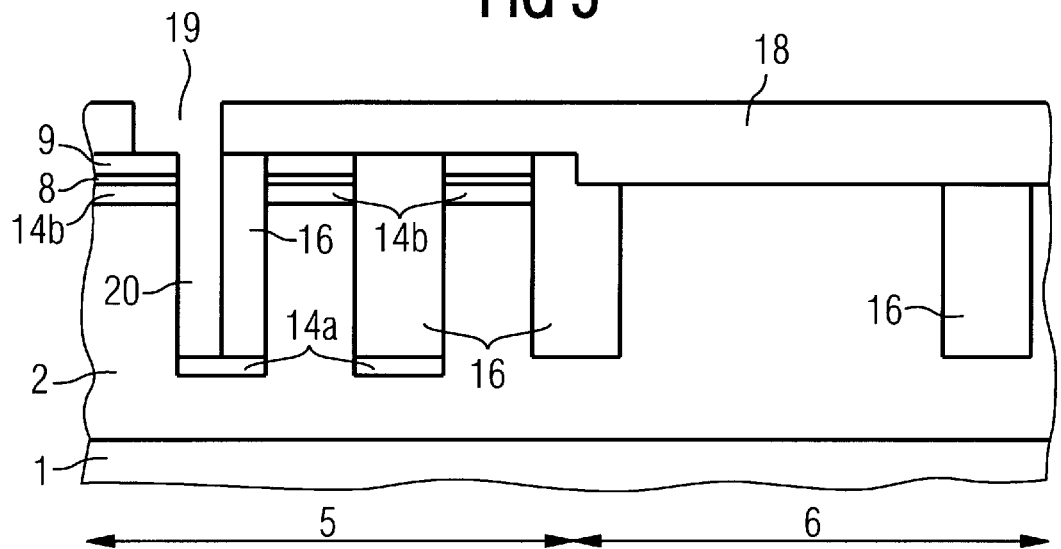
FIG. 5 shows the substrate after the etching of holes for forming first memory cells.

A photoresist mask 18 which contains the information that is to be stored in the read-only memory cell arrangement is produced over the entire surface (see FIG. 5). The photoresist mask 18 has openings 19 at the places where first memory cells are to be formed in the cell array 5. Places where second memory cells are to be formed in the cell array 5 are, in contrast, covered by the photoresist mask 18. The openings 19 in the photoresist mask have an essentially square cross-section parallel to the main surface 3, with a side length equal to a minimum structure width of, for example, F=0.4 μm. The photoresist mask 18 is adjusted in such a way that the centres of the openings 19 are arranged offset by one half of the structure width F relative to the centre of the insulation trenches 16. The fact that the adjustment is more accurate than the minimum structure width in a technology is exploited in this case. The periphery 6 is covered by the photoresist mask 18.

Holes 20 are etched into the insulation trenches 16 in an anisotropic dry etching process which attacks the trench filling 15 selectively with respect to the etching barrier layer 9. If the etching barrier layer consists of Si$_3$N$_4$, then the etching is carried out using C$_2$F$_6$, C$_3$F$_8$. If the etching barrier layer 9 consists of polysilicon, then the etching is carried out using HBr, Cl$_2$ He. The etching is carried out until 700 nm of SiO$_2$ have been removed. The holes 20 then extend to the surface of the strip-shaped doped region 14a which is arranged at the bottom of the respective insulation trench 16. Since the structured etching barrier layer 9 and the photoresist mask 18 act together as an etching mask, the width of the hole 20 perpendicular to the length of the insulation trenches 16 is less than the minimum structure width F in the respective technology. The semiconductor surface is exposed at a side wall and at the bottom of the hole 20.

The photoresist mask 18 is then removed. Etching products which have precipitated at the walls of the holes 20 during the anisotropic etching are removed in an HF dip. In order to improve the semiconductor surface, a thermal sacrificial oxide of, for example, 10 nm is then produced and subsequently removed by wet chemical means.

Figure 6:
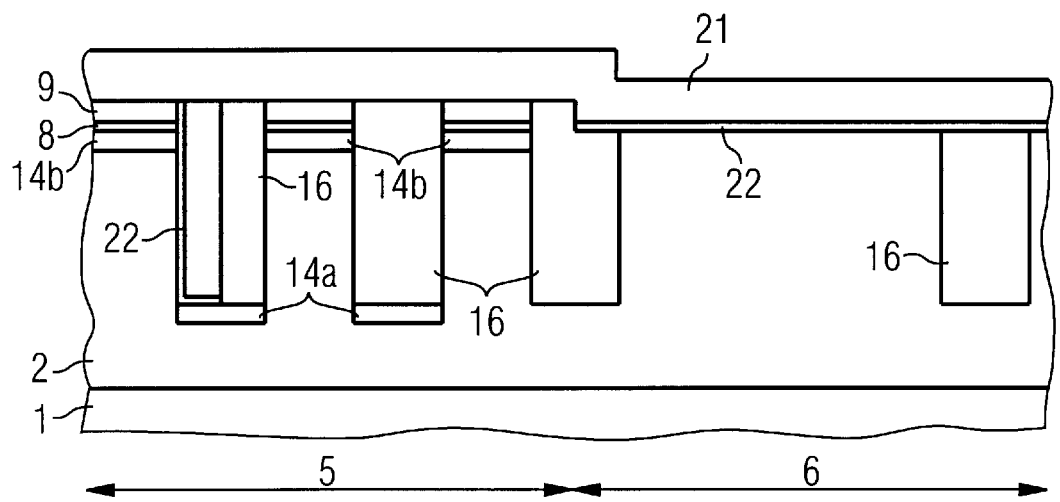
FIG. 6 shows the substrate after the formation of a gate oxide and the production of a doped polysilicon layer.

A gate oxide layer 22 is produced by thermal oxidation at exposed semiconductor surfaces in the holes 20 and at the periphery 6. The gate oxide layer 22 is produced to a thickness of, for example, 10 nm (see FIG. 6). A doped polysilicon layer 21 is then produced to a thickness of 400 nm. The doped polysilicon layer 21 is, for example, deposited in the undoped state and n-doped by implantation or diffusion, for example after POCl application. Alternatively, the doped polysilicon layer 21 is produced by in-situ doped deposition. The doped polysilicon layer 21 completely fills the holes 20.

Figure 7:
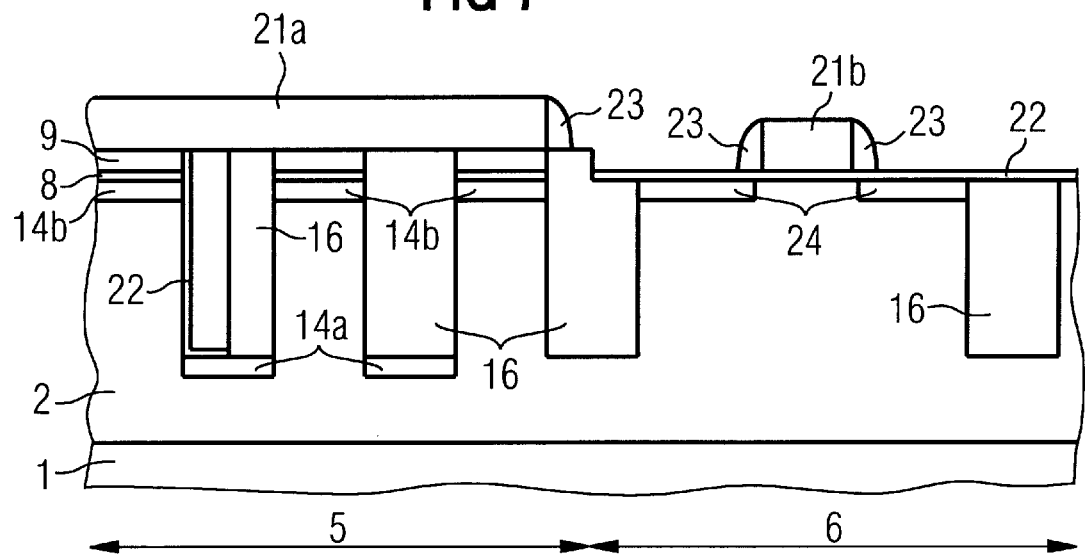
FIG. 7 shows the substrate after the doped polysilicon layer has been structured into word lines and gate electrodes for MOS transistors at the periphery, and after the production of source/drain regions for the peripheral MOS transistors.

Using photolithographic methods, the doped polysilicon layer 21 is structured in such a way that word lines 21a are formed in the region of the cell array 5 and gate electrodes 21b are formed in the region of the periphery 6 (see FIG. 7). That part of the doped polysilicon layer 21 which is arranged in the holes 20 acts as a gate electrode for vertical transistors which are formed by the doped strip-shaped regions 14a, 14b which abut against the respective hole 20, that part of the p-doped well 2 which lies in between and the gate oxide layer 22. The threshold voltage of these vertical MOS transistors is preset by the doping of the p-doped well 2.

The word lines 21a extend essentially perpendicularly to the insulation trenches 16. They have a width equal to a minimum structure width F and are arranged at a separation of, for example, F=0.4 $\mu$m. Neighbouring memory cells are insulated from one another by the separation of neighbouring word lines 21a along a flank of an insulation trench 16. 64 word lines 21a, for example, are arranged parallel and next to each other in the region of the cell array 5. The gate electrodes of the vertical MOS transistors are a priori connected to the respective word line 21a on account of the production process.

Lateral MOS transistors are produced at the periphery 6 for fabricating the read-only memory cell arrangement. For this purpose, $SiO_2$ spacers 23 are produced by conformal deposition and anisotropic etching of an $SiO_2$ layer at vertical flanks of the word lines 21a and of the gate electrodes 21b. Source/drain regions 24 are formed at the periphery 6 by implantation with, for example, arsenic at an energy of 50 keV and a dose of $5 \times 10^{15}$ $cm^{-2}$. Since the source/drain regions 24 of the MOS transistors at the periphery 6 are doped with the same conductivity type as the gate electrode 21b and the word lines 21a, this implantation can be carried out without an additional mask.

Other process steps known from MOS technology, for example LDD profile, HDD profile, salicide and similar techniques can be implemented for producing the lateral MOS transistors at the periphery 6.

It is also possible to produce a P-MOS transistor at the periphery by using additional masks and processes.

Finally, a planarizing intermediate oxide layer, for example of boron-phosphorus-silicate glass, is finally deposited over the entire surface and contact holes are opened in it. Contact holes are, inter alia, opened to the word lines 21a, to the strip-shaped doped regions 14a arranged at the bottom of the insulation trenches 16 and to the strip-shaped doped regions 14b arranged on the main surface 3 at the neighbouring insulation trenches 16. The contact holes are, for example, filled with tungsten. This is followed by the production of a metallization plane, for example by depositing and structuring an aluminium layer. A passivation layer is finally applied. These standard steps are not set out in detail.

In the read-only memory cell arrangement produced according to the invention, the memory cell is evaluated according to the "virtual ground" principle. Each of the strip-shaped doped regions 14a, 14b is assigned to two rows of memory cells. One pair of the strip-shaped doped regions 14a, 14b which is composed of adjacently arranged doped regions on the main surface 14a and at the bottom 14b is then uniquely assigned to one row of memory cells. When the read-only memory cell arrangement is read, the current flow between one strip-shaped doped region 14a at the bottom of an insulation trench and a neighbouring strip-shaped doped region 14b on the main surface 3 is therefore evaluated after selection via the word line 21a. The strip-shaped doped regions 14a, 14b at the bottom of the insulation trenches and on the surface 3 act as a reference or bit line according to the way in which they are connected.

Figure 8:
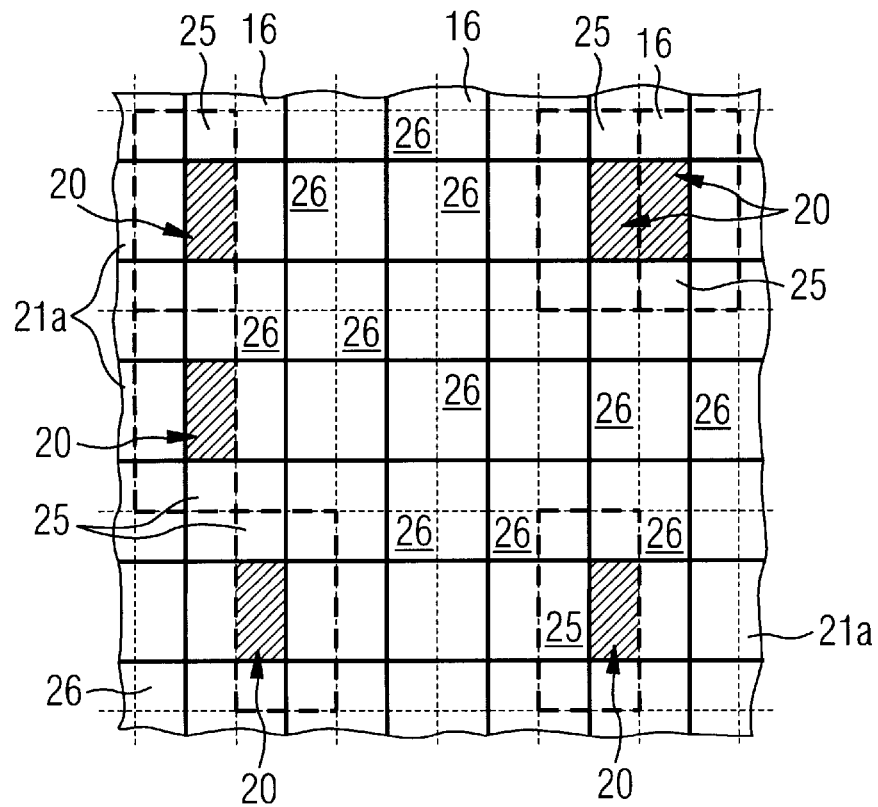
FIG. 8 shows a plan view of a cell array of a read-only memory cell arrangement according to the invention.

FIG. 8 shows a plan view of the cell array 5 of the read-only memory cell arrangement according to the invention. In the cell array 5, the read-only memory cell arrangement contains first memory cells 25 and second memory cells 26. The cell sizes of the first memory cells 25 and of the second memory cells 26 are indicated as dot-and-dash lines in FIG. 8. The first memory cells 25 are each outlined by a broken line. A first logic value is stored in each of the first memory cells 25, and a second logic value is stored in each of the second memory cells 26.

The first logic value is written into the first memory cells 25 by forming a vertical MOS transistor in the region of the first memory cells 25 by etching the hole 20 and forming gate oxide 22 and gate electrode 21, the gate electrode of this MOS transistor being connected into one of the word lines 21a.

The second logic value is written into the second memory cells 26 by not etching a hole in the region of the second memory cells 26 and thereby not producing a vertical MOS transistor in the rest of the production method. The word lines 21a extending over the second memory cells 26 are therefore not connected to a vertical gate electrode in the region of the second memory cells 26. The result of this is that, when a second memory cell 26 is selected, no current can flow through the corresponding strip-shaped doped regions 14a, 14b.

The read-only memory cell arrangement according to the invention can be produced using nine masks, lateral N-MOS transistors being produced at the periphery 6 simultaneously with the cell array 5. The area requirement of a memory cell 25, 26 is equal to $2F^2$ in the case of this illustrative embodiment, F being the smallest producible structure size in the respective lithography.

The invention is not limited to the particular details of the method and apparatus depicted and other modifications and applications are contemplated. Certain other changes may be made in the above described method and apparatus without departing from the true spirit and scope of the invention herein involved. It is intended, therefore, that the subject matter in the above depiction shall be interpreted as illustrative and not in a limiting sense.

What is claimed is:

1. Read-only memory cell arrangement, comprising:
   a cell array having memory cells on one main surface of a semiconductor substrate;
   the semiconductor substrate being doped with a first conductivity type at least in a region of the cell array;
   the memory cells having first memory cells, in which a first logic value is stored and which have at least one MOS transistor which is vertical to the main surface, and second memory cells, in which a second logic value is stored and which have no MOS transistor;
   a plurality of substantially parallel strip-shaped insulation trenches in the cell array;
   strip-shaped doped regions respectively arranged at a bottom of the insulation trenches and on the main surface between neighbouring insulation trenches, these regions being doped with a second conductivity type which is opposite of the first conductivity type, and extending essentially parallel to the insulation trenches;

the first and second memory cells, respectively arranged on opposite flanks of the insulation trenches;

each of the first memory cells having a hole which extends from one flank of one of the insulation trenches into the insulation trench, having a surface provided with a gate dielectric and filled with a gate electrode, so that strip-shaped doped regions abutting against the flank form source/drain regions of the vertical MOS transistor;

word lines, which extend transversely to the insulation trenches and which are each connected to gate electrodes of vertical MOS transistors arranged below a respective word line.

2. The read-only memory cell arrangement according to claim 1, wherein the separation between neighboring insulation trenches is essentially equal to a width of the insulation trenches, and wherein each of the holes extends in the first memory cells to half the width of the insulation trench.

3. Method for producing a read-only memory cell arrangement, comprising the steps of:

providing a semiconductor substrate having a main surface;

forming a cell array, having first memory cells in which a first logic value is stored and which have at least one MOS transistor vertical to the main surface, and second memory cells in which a second logic value is stored and which do not have MOS transistors, on the main surface of the semiconductor substrate;

doping the semiconductor substrate with a first conductivity type at least in a region of the cell array;

producing a plurality of substantially parallel strip-shaped insulation trenches;

forming strip-shaped doped regions at a bottom of the insulation trenches and on the main surface between neighbouring insulation trenches, these regions being doped with a second conductivity type which is the opposite the first conductivity type;

forming the first and second memory cells on respective opposite flanks of the insulation trenches, neighboring memory cells along a flank being insulated from each other;

forming, in order to form vertical transistors, holes, each of the holes abutting against a flank of one of the insulation trenches and extending to the doped region extending at the bottom of the insulation trench, a surface of these holes being provided with a gate dielectric and a gate electrode (21).

4. The method according to claim 3, wherein, to form the insulation trenches and the strip-shaped doped regions, a region which is doped with the second conductivity type and which extends over the entire cell array is produced on the main surface of the semiconductor substrate;

wherein a trench mask which defines the arrangement of the insulation trenches is produced;

wherein trenches are etched in an anisotropic dry etching process, with a trench mask being used as an etching mask, the strip-shaped doped regions arranged on the main surface between neighboring insulation trenches being formed by structuring the region doped with the second conductivity type;

wherein the strip-shaped doped regions arranged at the bottom of the trenches are formed by ion implantation, the trench mask acting as an implantation mask; and, after the trench mask has been removed, the insulation trenches are fabricated by filling the trenches with insulating material.

5. The method according to claim 4, wherein, before the ion implantation for forming the strip-shaped doped regions arranged at the bottom of the trenches, side walls of the trenches are covered with masking spacers which are removed before the trenches are filled.

6. The method according to claim 4 wherein an etching barrier layer, with respect to which the insulating material of the insulation trenches is selectively etchable, is produced under the trench mask, wherein the etching barrier layer is structured in accordance with the trench mask before the trenches are etched, wherein, after the insulation trenches have been fabricated, a photoresist mask which defines the arrangement of the first memory cells is produced, the holes for the vertical MOS transistors are opened in an anisotropic dry etching process in which the photoresist mask and the structured etching barrier layer together act as an etching mask.

7. The method according to claim 6, wherein the insulation trenches are filled with $SiO_2$, wherein the etching barrier layer contains at least one of the materials $Si_3N_4$, amorphous silicon and polysilicon, wherein the semiconductor substrate contains monocrystalline silicon at least in the region of the cell array.

8. The method according to claim 4, wherein a lateral extent of the region doped with the second conductivity type is defined by a photoresist mask which simultaneously covers a region for a periphery, wherein further trenches at the periphery are also etched using the trench mask, wherein the periphery is masked during the ion implantation for forming the strip-shaped doped regions at the bottom of the trenches, and wherein the trenches at the periphery are filled with insulating material.

* * * * *